(12) United States Patent
Lai et al.

(10) Patent No.: US 6,650,543 B2
(45) Date of Patent: Nov. 18, 2003

(54) HEAT DISSIPATION DEVICE

(75) Inventors: Cheng-Tien Lai, Tu-Chen (TW); Tsung-Lung Lee, Tu-Chen (TW); Shenghua Wang, Shenzhen (CN)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 10/122,098

(22) Filed: Apr. 12, 2002

(65) Prior Publication Data
US 2003/0151897 A1 Aug. 14, 2003

(51) Int. Cl.[7] ................................................. H05K 7/20
(52) U.S. Cl. .................. 361/700; 62/259.2; 165/104.33; 257/715
(58) Field of Search .............................. 165/80.3, 80.4, 165/185, 104.33; 62/259.2; 257/713–715; 174/15.1, 16.3; 361/699, 700, 717–719

(56) References Cited

U.S. PATENT DOCUMENTS 5,704,416 A * 1/1998 Larson et al. .......... 165/104.33
5,823,005 A * 10/1998 Alexander et al. .......... 62/259.2
5,953,930 A * 9/1999 Chu et al. .................. 62/259.2

OTHER PUBLICATIONS

USPGPUB US2002/0075652 A1, Berchowitz, filed Nov. 16, 2001.*
USPGPUB US2002/0066283 A1, Oh et al, filed Oct. 1, 2001.*
USPGPUB US2002/0101719 A1, Newton et al, filed Nov. 30, 2000.*

* cited by examiner

Primary Examiner—Gerald Tolin
(74) Attorney, Agent, or Firm—Wei Te Chung

(57) ABSTRACT

A heat dissipation device includes a vaporizing portion (10), a condensing portion (20), and a pair of pipes (50a, 50b). The vaporizing portion is attached to a heat-generating electronic chip (40) and contains liquid having great heat conductivity. The condensing portion receives vapor from the vaporizing portion, and cools the vapor to back to liquid form. The pipes are engaged with the vaporizing portion and the condensing portion, thus forming a circulatory route for the vapor from the vaporizing portion to the condensing portion, and for the liquid from the condensing portion to the vaporizing portion.

13 Claims, 2 Drawing Sheets

HEAT DISSIPATION DEVICE

BACKGROUND OF THE INVENTION

1. Field of the Invention

The present invention relates to heat dissipation devices, and more particularly to a heat dissipation device which has a circulatory route to attain great heat removal capability from an electronic device.

2. Description of Related Art

During operation of many electronic devices such as central processing units (CPUs), large amounts of heat are produced. Such heat must be quickly removed from the electronic device, to prevent the electronic device from becoming unstable or being damaged. Typically, a heat sink is directly attached to an outer surface of an electronic device to remove heat therefrom.

Developments in today's highly information-intensive society have led to remarkable improvements in performances of electronic devices. Copious amounts of heat are generated from modem electronic devices. Accordingly, modem heat sinks are frequently unduly large. Oftentimes, space available around an electronic device is insufficient to accommodate a large heat sink.

To overcome this problem, an alternative heat dissipation means provides a pipe structure to facilitate heat removal. Conventionally, the pipe provides capillarity to transfer heat away from the electronic device. However, a rate of heat transfer is inherently limited. The heat transfer capability of such heat dissipation means is all too often inadequate.

It is strongly desired to provide an improved heat dissipation device which overcomes the above-mentioned problems.

SUMMARY OF THE INVENTION

Accordingly, an object of the present invention is to provide a heat dissipation device which has double pipes to attain great heat removal capability.

In order to achieve the object set out above, a heat dissipation device of the present invention comprises a vaporizing portion, a condensing portion and a pair of pipes. The vaporizing portion is attached to a heat-generating electronic chip, and contains liquid having great heat conductivity. The condensing portion receives vapor from the vaporizing portion, and cools the vapor to back to liquid form. The pipes are engaged with the vaporizing portion and the condensing portion, thus forming a circulatory route for the vapor from the vaporizing portion to the condensing portion, and for the liquid from the condensing portion to the vaporizing portion.

Other objects, advantages and novel features of the present invention will become more apparent from the following detailed description when taken in conjunction with the accompanying drawings.

DETAILED DESCRIPTION OF THE INVENTION

Figure 1:
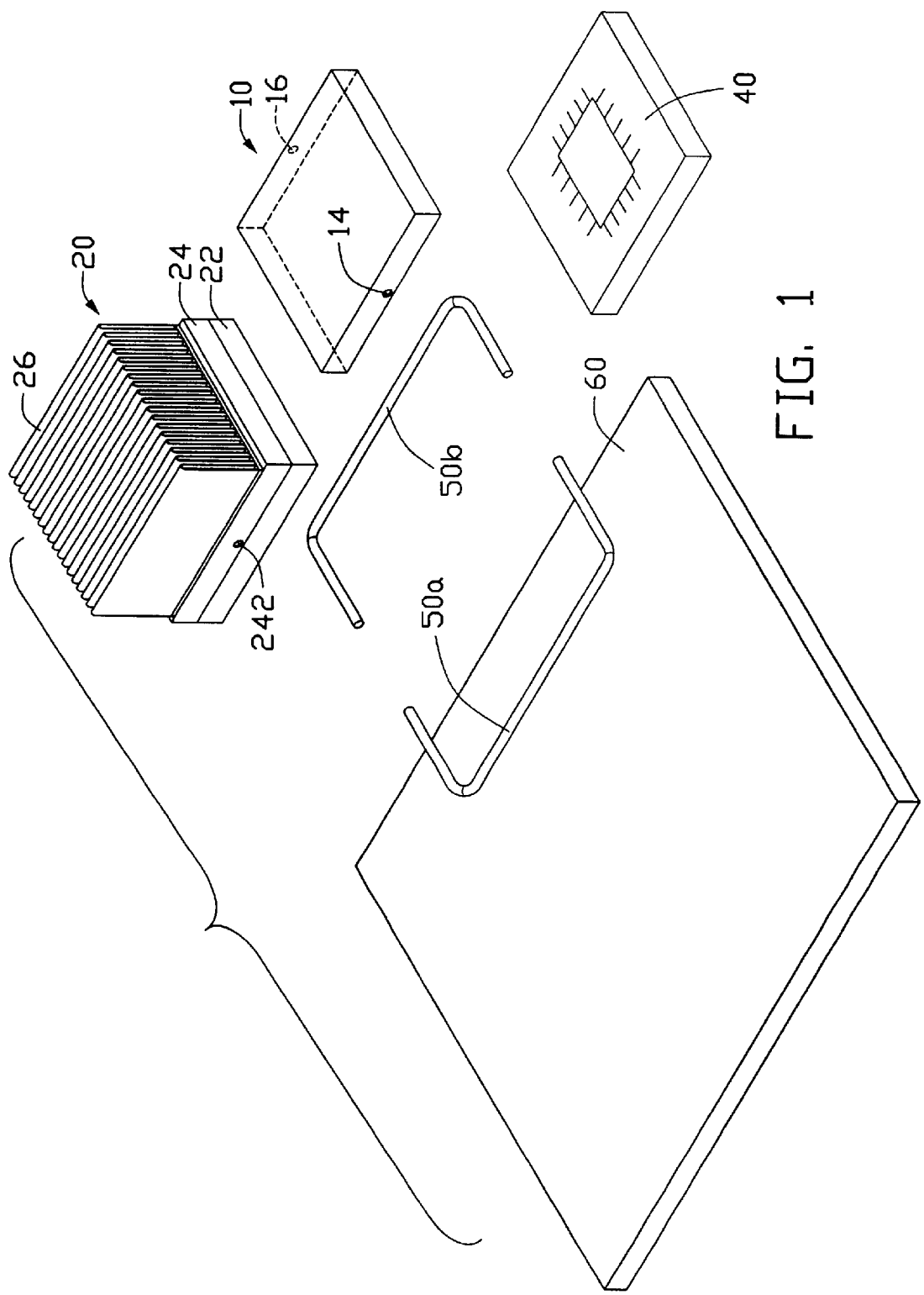
FIG. 1 is an exploded perspective view of a heat dissipation device in accordance with the pre sent invention, together with an electronic chip and a mother board.

Reference will now be made to the drawing figures to describe the present invention in detail.

Figure 2:
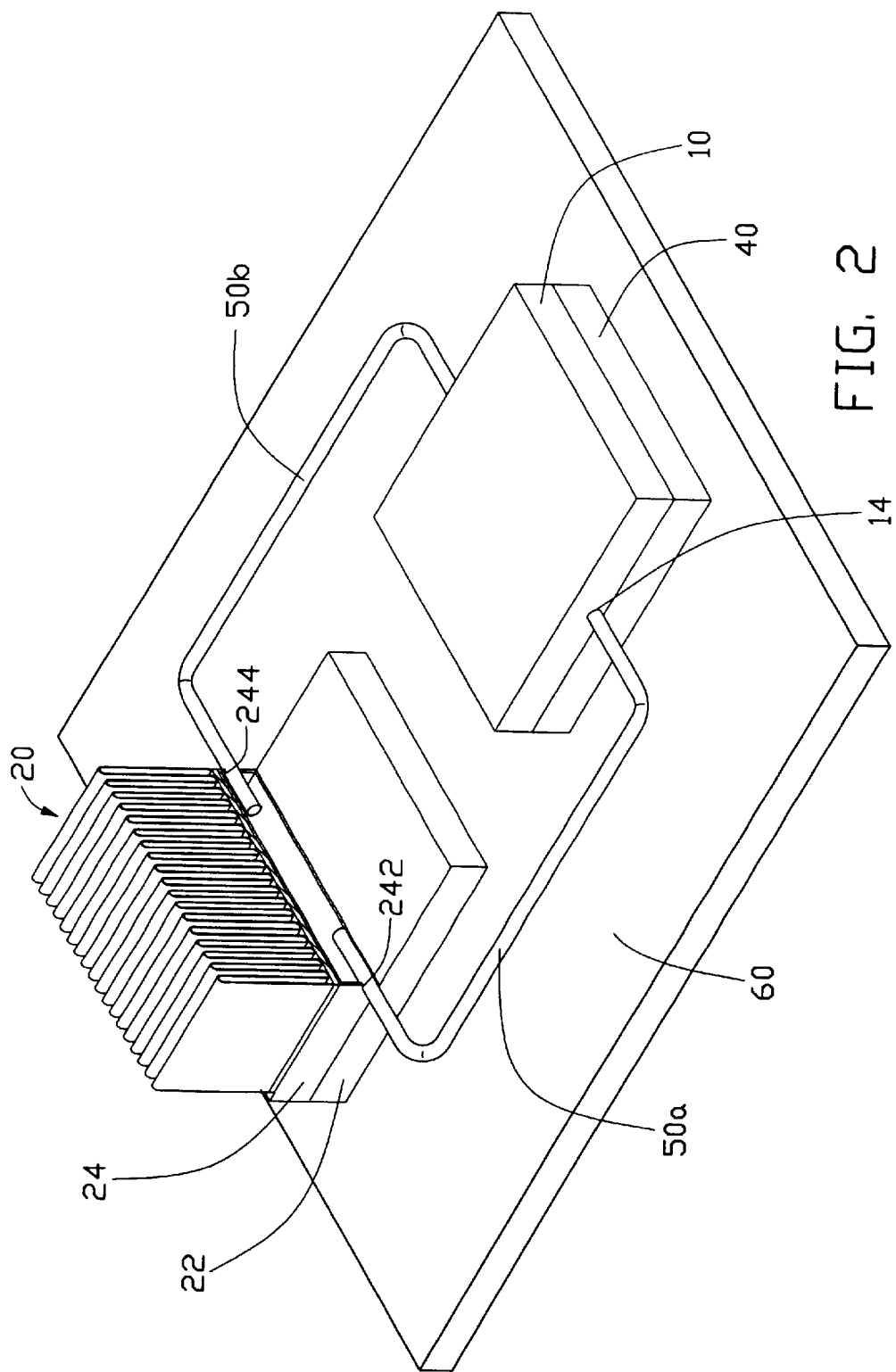
FIG. 2 is an assembled view of FIG. 1, with part of a condensing portion of the heat dissipation device cut away for better illustration.

FIGS. 1 and 2 show a heat dissipation device of the present invention, together with an electronic chip 40 and a mother board 60. The chip 40 is mounted on the mother board 60.

The heat dissipation device comprises a vaporizing portion 10 attached on the chip 40, a condensing portion 20, and a pair of pipes 50a, 50b. The pipes 50a, 50b connect between the vaporizing portion 10 and the condensing portion 20. The pipes 50a, 50b are each formed with a U-shaped configuration. However, as is well known in the field, the pipes 50a, 50b can be fabricated in a variety of shapes.

The vaporizing portion 10 is intimately attached on the chip 40, and defines a vaporizing chamber (not visible) containing liquid having great heat conductivity. An inlet 14 for liquid is defined in one side of the vaporizing portion 10. A vapor outlet 16 is defined in an opposite side of the vaporizing portion 10. The inlet 14 is disposed lower than the vapor outlet 16.

The condensing portion 20 is disposed separately from the vaporizing portion 10. The condensing portion 20 comprises a heat-conductive pad 22, a condensing chamber 24, and a plurality of heat sink fins 26. The pad 22 is attached to the mother board 60. The condensing chamber 24 is attached on the pad 22, and contains liquid having great heat conductivity. The heat sink fins 26 are attached on the condensing chamber 24, for facilitating heat dissipation. The condensing chamber 24 defines an outlet 242 for liquid in a sidewall thereof. A vapor inlet 244 is defined in an opposite sidewall of the condensing chamber 24. The vapor inlet 244 of the condensing chamber 24 is disposed higher than the outlet 242.

Referring particularly to FIG. 2, in assembly of the heat dissipation device, an end of the pipe 50a is engaged in the inlet 14 of the vaporizing portion 10. An opposite end of the pipe 50a is engaged in the outlet 242 of the condensing chamber 24. The inlet 14 of the vaporizing portion 10 and the outlet 242 of the condensing chamber 24 are sealed. Liquid having great heat conductivity is injected into the condensing chamber 24 through the inlet 244 thereof. An end of the pipe 50b is engaged in the vapor outlet 16 of the vaporizing portion 10. An opposite end of the pipe 50b is engaged in the vapor inlet 244 of the condensing chamber 24. The vapor outlet 16 of the vaporizing portion 10 and the vapor inlet 244 of the condensing chamber 24 are then sealed. Thus, a sealed circulatory route for liquid and vapor is attained.

In operation of the heat dissipation device, the vaporizing portion 10 is attached on the chip 40 that is mounted on the mother board 60. The condensing portion 20 is attached on the mother board 60 separately from the combined vaporizing portion 10 and chip 40. During operation of the chip 40, the liquid in the vaporizing portion 10 is heated by heat of the chip 40 to form vapor. The vapor flows from the vaporizing portion 10 to the condensing chamber 24 through the pipe 50b. The vapor accumulated in the condensing chamber 24 is cooled back to liquid form, and flows back to the vaporizing portion 10 through the pipe 50a. Thus heat generated from the chip 40 is transferred by the vapor to the condensing portion 20 and then dissipated. The condensing liquid flows back to the vaporizing portion 10 for further transferring of heat from the chip 40. The above-mentioned process is a continuous circulatory cycle, so that the heat generated from the chip 40 is efficiently removed therefrom.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A heat dissipation assembly comprising:
   a printed circuit board;
   a heat-generating electronic device mounted on the printed circuit board; and
   a heat dissipation device comprising a vaporizing portion attached on the electronic device, and a condensing portion connected to the vaporizing portion by a pair of separate pipes, the pipes cooperating with the vaporizing portion and the condensing portion to form a sealed circulatory route for liquid and vapor in the heat dissipation device, wherein the vapor flows from the vaporizing portion to the condensing portion and the liquid flows from the condensing portion to the vaporizing portion;
   wherein a heat conductive pad is attached on an underside of the condensing portion.

2. The heat dissipation assembly as claimed in claim 1, wherein a plurality of heat sink fins is attached to the condensing portion for facilitating heat dissipation.

3. The heat dissipation assembly as claimed in claim 1, wherein the condensing portion is separate from the vaporizing portion and the electronic device.

4. The heat dissipation assembly as claimed in claim 1, wherein the condensing portion has a vapor inlet and a liquid outlet, and the vapor inlet is located higher than the liquid outlet.

5. A heat dissipation assembly comprising:
   a heat-generating electronic device;
   a heat dissipation device comprising:
      a vaporizing portion contacting the heat-generating electronic device and defining a vapor outlet and liquid inlet thereof;
      a condensing portion spaced from said vaporizing portion and defining a vapor inlet and a liquid outlet thereof;
      a heat sink contacting the condensing portion; and
      a pair of pipe sections respectively connected between the vapor outlet and the liquid inlet, and between the vapor inlet and the liquid outlet; wherein
         one of said pipe sections is for liquid transmission and the other is for vapor transmission, and the vapor portion transforms liquid to vapor while the condensing portion transforms vapor to liquid; wherein
         said vapor outlet is higher than the liquid inlet, and said vapor inlet is higher than the liquid outlet, while the vapor outlet is substantially of the same level with the vapor inlet and the liquid outlet is substantially of the same level with the liquid inlet, thereby each of said pipe sections extending horizontally.

6. The assembly as claimed in claim 5, wherein ends of one of said pair of pipe sections are separated from those of the other, in the corresponding vapor portion and condensing portion, so as to form a circulatory route via cooperation of all the pair of pipe sections, the vapor portion and the condensing portion rather than the pair of pipe sections alone.

7. A heat dissipation device comprising:
   a vaporizing portion adapted for being attached to a heat-generating electronic device, said vaporzing portion containing liquid therein, wherein the liquid can be converted into vapor when it is heated by the electronic device;
   a condensing portion for receiving the vapor from the vaporizing portion and cooling the vapor into liquid; and
   a pair of pipes respectively engaged with the vaporizing portion and the condensing portion to form a circulatory route for the vapor from the vaporizing portion to the condensing portion and for the liquid from the condensing portion to the vaporizing portion;
   wherein a heat conductive pad is attached on an underside of the condensing portion.

8. The heat dissipation device as claimed in claim 7, wherein the condensing portion and the vaporizing portion are separate from each other and connected by the pipes.

9. The heat dissipation device as claimed in claim 7, wherein one of the pipes provides vapor in the vaporizing portion with access to the condensing portion.

10. The heat dissipation device as claimed in claim 9, wherein the other of the pipes provides liquid in the condensing portion with access to the vaporizing portion.

11. The heat dissipation device as claimed in claim 7, wherein a plurality of heat sink fins is attached to the condensing portion for facilitating heat dissipation.

12. The heat dissipation device as claimed in claim 7, wherein the vaporizing portion has a vapor outlet and a liquid inlet, and the vapor outlet is located higher than the liquid inlet.

13. The heat dissipation device as claimed in claim 12, wherein each of the pipes has a U-shaped configuration.

* * * * *